(12) United States Patent
Klappauf et al.

(10) Patent No.: US 10,476,497 B2
(45) Date of Patent: Nov. 12, 2019

(54) SAFE SWITCHING DEVICE

(71) Applicant: B&R INDUSTRIAL AUTOMATION GMBH, Eggelsberg (AT)

(72) Inventors: Christof Klappauf, Ainring (DE); Christian Schneider, Hochburg (AT); Norbert Winkler, Hoehnhart (AT)

(73) Assignee: B&R INDUSTRIAL AUTOMATION GMBH, Eggelsberg (AT)

( * ) Notice: Subject to any disclaimer, the term of this patent is extended or adjusted under 35 U.S.C. 154(b) by 0 days.

(21) Appl. No.: 16/138,073

(22) Filed: Sep. 21, 2018

(65) Prior Publication Data

US 2019/0097628 A1 Mar. 28, 2019

(30) Foreign Application Priority Data

Sep. 22, 2017 (EP) .................................. 17192613

(51) Int. Cl.
*G05B 9/02* (2006.01)
*H03K 17/18* (2006.01)
(Continued)

(52) U.S. Cl.
CPC ............... *H03K 17/18* (2013.01); *G05B 9/02* (2013.01); *H02H 7/0844* (2013.01); *H02P 3/06* (2013.01);
(Continued)

(58) Field of Classification Search
CPC ......... G05B 9/02; H02P 29/02; H02P 29/024; H02P 29/025; H02P 29/026; H02P 3/06;
(Continued)

(56) References Cited

U.S. PATENT DOCUMENTS

| 5,303,156 A | * | 4/1994 | Matsuoka | ............ | B62D 5/0487 |
| | | | | | 180/404 |
| 10,110,144 B2 | | 1/2018 | Faschang | | |

(Continued)

FOREIGN PATENT DOCUMENTS

| AT | 516568 | 6/2016 |
| DE | 103 07 999 | 9/2004 |

(Continued)

OTHER PUBLICATIONS

Europe Search Report conducted in counterpart Europe Appln. No. 17 19 2613 (dated Feb. 1, 2018).

*Primary Examiner* — William Hernandez
(74) *Attorney, Agent, or Firm* — Greenblum & Bernstein, P.L.C.

(57) ABSTRACT

Method and device for safe switching of a signal between a first and second point. Device includes a first branch having a first switch and second switch arranged between the first and second point, and a parallel second branch having a third switch and fourth switch. A testing device instructs a control unit, in a test sequence, to open the first switch for a first period of time, open the second switch for a second period of time, open the third switch for a third period of time, and open the fourth switch for a fourth period of time. Neither the first nor second periods of time overlap with the third or fourth period of time. A testing unit tests functioning of the switches during respective period of time, and generates an error signal in the event of a malfunction of at least one switch.

16 Claims, 5 Drawing Sheets

(51) Int. Cl.
*H03K 17/296* (2006.01)
*H02P 3/06* (2006.01)
*H02P 29/02* (2016.01)
*H02H 7/08* (2006.01)
*H02M 1/32* (2007.01)
*H02P 25/06* (2016.01)

(52) U.S. Cl.
CPC ............ *H02P 29/02* (2013.01); *H03K 17/296* (2013.01); *H02M 1/32* (2013.01); *H02P 25/06* (2013.01)

(58) Field of Classification Search
CPC ...... H03K 17/00; H03K 17/18; H03K 17/296; H03K 17/56; H03K 17/60; H03K 17/687
USPC .................................. 327/365, 403, 404, 405
See application file for complete search history.

(56) References Cited

U.S. PATENT DOCUMENTS

| | | | |
|---|---|---|---|
| 2002/0008567 A1* | 1/2002 | Henry | H02M 3/07 327/536 |
| 2002/0041502 A1* | 4/2002 | Ulinksi | H02J 3/32 363/37 |
| 2004/0165404 A1 | 8/2004 | Eckardt et al. | |
| 2014/0139159 A1 | 5/2014 | Sato | |
| 2016/0006237 A1 | 1/2016 | Helmerth et al. | |
| 2016/0241173 A1 | 8/2016 | Prüssmeier et al. | |
| 2019/0123543 A1* | 4/2019 | Dubey | H02H 3/20 |

FOREIGN PATENT DOCUMENTS

| | | |
|---|---|---|
| DE | 10 2015 102 236 | 8/2016 |
| EP | 2 733 807 | 5/2014 |
| WO | 2014/139549 | 9/2014 |

* cited by examiner

SAFE SWITCHING DEVICE

CROSS-REFERENCE TO RELATED APPLICATIONS

The present application claims priority under 35 U.S.C. § 119(a) of European Patent Application No. 17192613.2 filed Sep. 22, 2017, the disclosure of which is expressly incorporated by reference herein in its entirety.

BACKGROUND OF THE INVENTION

1. Field of the Invention

The present invention relates to a method and switching device for switching a signal on a connection between a first point and a second point.

2. Discussion of Background Information

A wide variety of safety functions are used in connection with electric drives, the object of which safety functions is to reduce the risk for both man and the machine itself. Safe pulse inhibition counts among the most common and most basic safety functions associated with electric drives. In general, safe pulse inhibition is designated as a "Safe Torque Off function" or "STO function," for which reason only the designation STO function will be used hereinafter in this context. The object of an STO function is to switch the electric drive without torque. The aim is that the electric drive does not continue to receive current, which could lead to a rotational movement. The STO function thus ensures that no torque-forming current can continue to act on the electric drive, and that a continuous rotational movement or an undesired start-up is prevented. Of course, this also applies in an analogous manner for driving linear motors and the linear movement thereof. In this context, the STO function is used widely, for example, in production and handling equipment. As the monitoring of the standstill position does not take place through the typical STO function itself, the STO function is typically realized by disabling the power supply of the driver. This design is used in applications where the drive itself comes to a standstill in a sufficiently short time through the load torque or friction, or where the turning off of the drive does not have relevance in terms of safety. If no appropriate brake systems are otherwise provided for risk mitigation, the electric drive runs down unbraked after activation of the STO function.

AT 516568 B1 therefore discloses in order to realize an STO function—separating a PWM signal that drives the power switch for transmitting a pulse signal. In this manner, the supply of energy to the drivers of the power switch is not interrupted, but rather the pulse signal itself is blocked. Any required energy storage or capacitors can be sized to a smaller dimension than when driver power supply is interrupted, because transmitting the pulse signal requires only very little energy, thus reduced the portion of energy that is to be saved. Interrupting the pulse signal thus lowers time delays and causes the safety function to be triggered considerably faster than with switching according to the prior art.

Implementing a safety function such as, for example, the STO function, in particular, with long-stator linear motors (LLMs), requires safely interrupting circuits in the event of a failure, for which reason it is important to make the function of circuits for interrupting these circuits safe. "Safe" in this context refers always to a functional safety or certainty with which it is to be made sure that a certain function can be ensured with sufficient reliability, depending on the relevant safety requirements imposed (e.g., a safety integrity level (SIL)). If, for example, the relevant switch is closed for a longer time because no failure occurs for a long time, it may occur that the switch cannot be opened when the switch does experience a failure. This effect may occur, for example, because of corrosion or because of fixed welding, due to permanently-circulating current. It would thus be necessary to regularly test the correct functioning of the switch. Of course, the actual circuit would be interrupted in such testing, as a result of which the testing is non-trivial for operation.

SUMMARY OF THE EMBODIMENTS

Embodiments of the invention address the problem of setting forth a switching device and method for safely switching a signal.

This problem is solved according to the invention by a method of passing the signal through a first switch and a serial second switch in a first branch connecting the first point and the second point, and passing the signal through a third switch and a serial fourth switch in a second branch that is parallel to the first branch and connects the first point and the second point. In a test sequence, the first switch is opened for a first period of time, and then closed again, the second switch is opened for a second period of time and then closed again, the third switch is opened for a third period of time and then closed again, and the fourth switch is opened for a fourth period of time and then closed again, wherein neither the first period of time nor the second period of time overlaps with the third or fourth period of time. The functioning of the switches is tested during the respective period of time, and an error signal is generated in the event of a malfunction of at least one switch.

The problem is also solved by a switching device with which a first branch having a first switch and a serial second switch is arranged between the first point and the second point, and a second branch having a third switch and a serial fourth switch is arranged parallel to the first branch. At least one control unit, which is connected to the switches and is configured to control same by means of control signals, is provided. Also provided is a testing device that is connected to the at least one control unit and is configured to instruct the at least one control unit, in a test sequence, to open the first switch for a first period of time and then close same again, open the second switch for a second period of time and then close same again, open the third switch for a third period of time and then close same again, and open the fourth switch for a fourth period of time and then close same again, wherein neither the first period of time nor the second period of time overlaps with the third or fourth period of time. Further provided is at least one testing unit configured to test the functioning of the switches during the respective periods of time, and to generate an error signal in the event of a malfunction of at least one switch.

At least two parallel branches thus connect the first point and the second point, and each transmits the signal. Each branch has at least two switches, wherein, as a matter of course, more than two branches may be provided and also more than two switches may be provided in each of the branches, in order to produce additional redundancy. In a test sequence, all of the switches are opened at least once, and the functioning of the switches is tested. The switches may then be configured basically as openers or also as closers. Passing the signal in parallel through the at least two branches thus makes it possible to open and then close again the switches of one of the branches. The signal is thus interrupted in the branch, yet continues to be passed through a different branch between the first point and the second point, provided that the switches of the other branch remain closed at that point in time. The switches that are opened and closed again are tested for functioning by the testing device during the switching process—i.e., during the opening and/or during the opened state and/or during the closing, wherein an error signal that can be outputted and/or further processed is generated in the event of a malfunction of at least one of the switches. As a matter of course, a plurality of control units that are separated from one another may also be provided in order to control a plurality of switches, or even one separate control unit per switch may be provided. This ensures further reliability.

Advantageously, the at least one testing unit is connected to the at least one control unit and configured to instruct the at least one control unit to control the switches to open when an error signal has been generated. Using a plurality of redundant testing units that each generate an error signal results in even greater reliability. "Control" here does not necessarily mean that something must be done actively. The switches may also be configured as closers that are opened by default, without control, e.g., by control signals. It may also happen, of course, that a control signal is interrupted, whereby no direct control for opening can take place. In this case, it is especially advantageous when the switches are opened by default, i.e., even without application of a control signal. Thus, the error signal generated by the at least one testing unit is processed and forward to the at least one control unit, which interrupts the signal to all of the branches. This is possible provided that at least one switch per branch is still functional, i.e., can be opened. The more switches are present in a branch, the greater the likelihood of being able to interrupt the signal in the event of a malfunction, by means of the remaining switches in that branch.

Preferably, a first potential of a first test point located between the first and second switch is tested, and a second potential of a second test point located between the third and fourth switches is tested, in order to make a determination regarding a malfunction of at least one switch, wherein it is especially advantageous when the first potential is tested during the first period of time and/or the second period of time, and the second potential is tested during the third period of time and/or the fourth period of time. There can thus be determined to be a malfunction in at least one switch if the first test point and/or the second test point does not have the potential that should apply if the connected switches are properly opened or closed. The periods of time may be conveyed to the at least one testing unit by the testing device, or by the at least one control unit. It is, however, especially advantageous when the testing device uses the potentials to recognize whether the switches are closed or open, and make a determination therefrom regarding the proper functioning of the switches.

Advantageously, the first and second period of time and the third/fourth period of time, respectively, overlap at least partially. This makes it possible to test the first potential during the overlapping of the first and second periods of time, and test the second potential during the overlapping of the third and fourth periods of time, thus enabling pairwise testing of the switches of a branch.

The first potential can be compared with the second potential during the overlapping of the first and second periods of time, and the second potential can be compared with the first potential during the overlapping of the third and fourth periods of time. For example, a switch of a branch may have opened and thus have zero potential. It can thus be assumed that the switches of the other branch are closed, and thus must be at the potential of the first point/the second point (typically, the first point and the second point have the same potential, due to being connected via at least one branch). If this is not the case, then one of the switches must have a malfunction.

It is especially advantageous to test for whether the first test point has zero potential during the overlapping of the first and second periods of time, and for whether the second test point has zero potential during the overlapping of the third and fourth periods of time. If, for example, both of the switches that are connected to the relevant test point have been opened correctly, then this test point must have a so-called floating potential, i.e., have zero potential at the point in time of the overlapping of the periods of time of the switches connected to the test point. If, however, a switch is defective, i.e., has not been opened correctly, then the potential of the first point/the second point (depending on which point of the switches connects to the relevant test point) is also at the test point.

There may also be provided at least one inhibiting input, that is configured to control the switches to open when an inhibit signal is applied. The inhibit signal may be applied externally, in which case, for example, an STO function can be realized in order to safely interrupt the signal. Thus, the inhibiting input represents an STO input, and the inhibit signal represents an STO signal.

Advantageously, the at least one inhibiting input is connected to the at least one control unit and configured to instruct same to control the switches to open when an inhibit signal is applied. The at least one inhibiting input may, of course, also be configured to control the switches to open automatically, via special switch-off signals, when an inhibit signal is received. Of course, the at least one inhibiting input may also both control to open via switch-off signals and also additionally instruct the at least one control unit to open the switches by means of the control signals. So doing would, through increased circuit complexity, result in further redundancy because the switches are controlled to open via the switch-off signals as well as via the control signals.

Advantageously, the inhibit signal is dynamized and subsequently rectified, before being further processed in the switching device in order to control the switches to open. For this purpose, the at least one inhibiting input may be connected via a rectifier circuit to the at least one control unit, wherein the rectifier circuit is configured in order to dynamize and rectify the inhibit signal. The inhibiting input is thus connected to the input of the rectifier circuit, which is configured on the output side to the at least one control unit. Thus, when an inhibit signal is applied, the inhibiting input instructs the at least one control unit to control the switches to open, wherein the signal has, however, been previously dynamized, i.e., an oscillating signal is converted and subsequently rectified. Thus, on the one hand, the inhibit signal can be amplified because the inhibiting input is typically digitally designed, and also static failure can be ruled out. The rectification may take place, for example, via a charge pump, in order to rectify high-frequency interference and thus avoid accidental activation of the inhibit signal. In general, where an inhibit signal is present, the switches are only controlled to open after the value falls below a response threshold. The dynamized and rectified inhibit signal thus runs according to an RC discharge curve, due to the discharging of the capacitor of the charge pump.

The rectification, depending on the dimensioning of the rectifier, attenuates or suppresses a short pulse of the original inhibit signal, thus preventing the switches of the switching device from being opened, because the response threshold is not reached. Thus, for example, the switches can be prevented from accidentally opening. The dynamization and subsequent rectification also, however, enables "safe" enhancement of the inhibit signal. This dynamization and subsequent rectification also, however, delays intended triggering due to lasting application of the inhibit signal by a trigger time until the response threshold is reached. Delaying by the trigger time is also useful for testing that the inhibit signal is being applied correctly at the inhibiting input during operation. It is possible for the error signal to be generated without being applied to the inhibiting input, e.g., due to a cable break. An inhibit signal can thus be triggered briefly, i.e., during the trigger time, thus preventing the response threshold from being reached. In this time, it may be checked at the inhibiting input whether the inhibit signal is being applied correctly before the signal is actually interrupted. An inhibit signal applied (very) briefly as a test can thus be filtered, for example, by means of the charge pump directly in the switching device. It is, however, also possible for the signal to be briefly interrupted due to an inhibit signal applied as a test, for example, because the interruption is somewhat longer than the trigger time. Such short-term interruption of the signal may, however, in turn be filtered out, for example, by back-up capacitors at the input of a driver circuit of a bridge circuit that is controlled by the signal. The signal is thus itself supported, thus preventing a brief interruption of the inhibit signal from having in turn a negative effect on the functioning of the circuit and thus maintaining the signal.

The inhibit signal may also be applied to a plurality of inhibiting inputs, for example, if a plurality of control units and/or rectifier circuits are present. Thus, for example, two rectifier circuits may each receive the inhibit signal, and also instruct at least one switch per branch to open, e.g., via control units assigned to the switches. Thus, a first inhibiting input may control the first switch in the first branch and the third switch in the second branch to open when the inhibit signal is applied, e.g., via a first rectifier circuit (optionally each via a separate control unit per switch). Then, a second inhibiting input may control the second switch in the first branch and the fourth switch in the second branch to open when the inhibit signal is applied, e.g., via a second rectifier circuit (optionally also each via a separate control unit per switch).

There may also be present another series switch that is connected in series to the two branches between the first and second points, and also can be controlled to open by the at least one testing unit and/or through the inhibit signal.

A switching device according to the invention may be used to switch off the supply voltage to the driver circuit of a bridge circuit, and/or a PWM signal of a long-stator linear motor or rotary motor that is supplied to the driver circuit. The signal thus represents the supply voltage of the driver circuit of the power switches and/or the PWM signal of the driver circuit. An STO function can thus be realized by interrupting the signal when an error signal is applied.

Other exemplary embodiments and advantages of the present invention may be ascertained by reviewing the present disclosure and the accompanying drawing.

BRIEF DESCRIPTION OF THE DRAWINGS

The present invention shall be described in further detail hereinbelow with reference to FIGS. 1 to 7, which illustrate advantageous embodiments of the present invention by way of example, in a schematic and non-limiting manner. In the drawings.

DETAILED DESCRIPTION OF THE EMBODIMENTS

Figure 1:
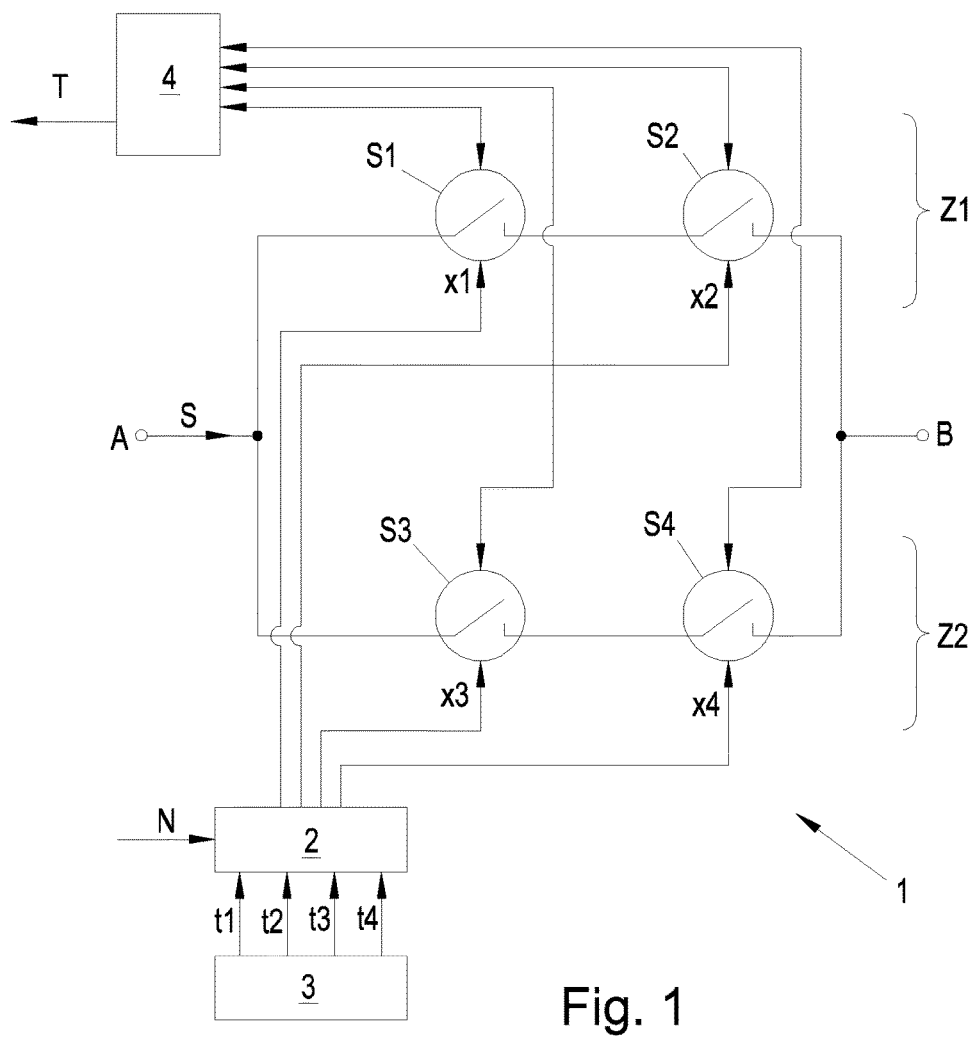
FIG. 1 illustrates a configuration of the switching device.

FIG. 1 illustrates a switching device 1 according to the invention for switching off a signal S, which is transmitted here from a first point A to a second point B. The first point A is connected to the second point B via a first branch Z1 and a second branch Z2 that is parallel thereto. This makes it possible to transmit the signal S from the first point A to the second point B—or even from the second point B to the first point A, when the direction of the signal S is inverted—both via the first branch Z1 and via the second branch Z2. In the first branch Z1, a first switch S1 and a serial second switch S2 are arranged; analogously, a third switch S3 and a serial fourth switch S4 are arranged in the second branch Z2. The switches S1, S2, S3, S4 are often configured to be null-active, which means that they are closed when they are activated, and opened when they are not activated, and are advantageously realized as semiconductor switches, e.g., as bipolar transistors. As a matter of course, more switches S1, S2, S3, S4—and even more parallel branches Z1, Z2—than are depicted in FIG. 1 may be present in the switching device 1, in order to produce additional redundancy.

The signal S is an electrical signal, typically an electrical voltage, for example, a supply voltage for one or more components, or a pulse sequence (e.g., a PWM signal).

A control unit 2 that can open and close the switches S1, S2, S3, S4 with the use of suitable control signals x1, x2, x3, x4 is provided. When the switches S1, S2, S3, S4 are closed, the signal S can flow via the first branch Z1 and also via the second branch Z2 from the first point A to the second point B, or, conversely, from the second point B to the first point A. If the first and/or second switch S1, S2 in the first branch Z1 has been opened, then the signal S can still flow through the closed third and fourth switches S3, S4 of the second branch Z2. In the reverse case, where the third and/or fourth switches S3, S4 have been opened, the signal S can flow through the closed first and second switches S1, S2. If at least one switch S1, S2, S3, S4 per branch Z1, Z2 has been opened, then the signal S would be interrupted. This would be the case in FIG. 1 when the first switch S1 and/or the second switch S2 have been opened (the signal S through the first branch Z1 is interrupted) and the third switch S3 and/or the fourth switch S4 have been opened (the signal S through the second branch is interrupted).

If, however, a switch of the first branch Z1—i.e., here, the first or second switch S1, S2—has a malfunction and thus cannot be opened, then the signal S can still be interrupted through the remaining functional switch(es) S1, S2 in the first branch Z1. The same applies to the switches in the second branch Z2—i.e., here, the third and fourth switches S3, S4. If one of the switches S1, S2, S3, S4 in one of the branches Z1, Z2 malfunctions, the signal S can thus still safely be switched off that branch Z1, Z2. The more switches S1, S2, S3, S4 are present in a branch Z1, Z2, the greater the likelihood, of course, of being able to interrupt the signal S in the event of a malfunction, by means of the remaining switches S1, S2, S3, S4. This redundancy is to ensure the functional safety (e.g., in the sense of the norm EN/IEC 61508) of the switching device 1.

It should be noted, however, that with a plurality of branches Z1, Z2, there exist a plurality of parallel paths for the signal S that all need to be separated by the switches S1, S2, S3, S4. Of course, it is not possible to interrupt the signal S between the first point A and the second point B if all of the switches S1, S2, S3, S4 of the same branch Z1, Z2—i.e., here, for example, the first switch S1 and the second switch S2 of the first branch Z1 or the third switch S3 and the fourth switch S4 of the second branch Z2 have a malfunction, i.e., cannot be opened.

In order to minimize the risk of malfunctioning of a switch S1, S2, S3, S4, and thus to further increase the functional safety, a testing device 3 has provided thereon a test sequence T that, by means of the control signals x1, x2, x3, x4 of the control unit 2, opens and closes the switches S1, S2, S3, S4 during ongoing operation, i.e., while the signal S is being passed between the first point A and the second point B, while a testing unit 4 is testing the proper functioning of the switches S1, S2, S3, S4. In the test sequence T, the first switch S1 is opened for a first period of time t1, and then closed again, the second switch S2 is opened for a second period of time t2 and then closed again, the third switch S3 is opened for a third period of time t3 and then closed again, and the fourth switch S4 is opened for a fourth period of time t4 and then closed again, such as is depicted by way of example in FIG. 2. The ordering of the periods of time t1, t2, t3, t4 is thus fundamentally not important, and one or more switches S1, S2, S3, S4 may also be switched a plurality of times in one test sequence T. The functioning of the switches S1, S2, S3, S4 is tested by the testing unit 4 during the periods of time t1, t2, t3, t4, i.e., during the opening or closing of—or during the opened state of—the switches S1, S2, S3, S4. If at least one circuit S1, S2, S3, S4 has been determined to be malfunctioning by the testing unit 4, then an error signal F is outputted and/or also used for other purposes, e.g., in order to generate an STO signal and thus control the switches S1, S2, S3, S4 to open, as shall be described in further detail below.

Figure 2:
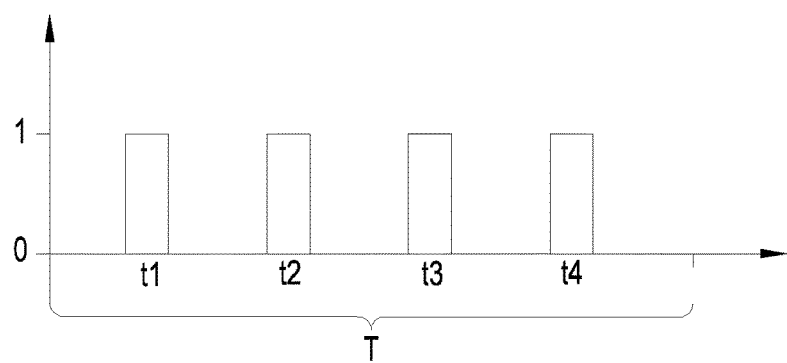
FIG. 2 illustrates a test sequence with sequential periods of time.

FIG. 2 depicts a test sequence T that has consecutive, non-overlapping periods of time t1, t2, t3, t4. It is thus ensured, in any case, that the signal S is not interrupted between the first point A and the second point B during the functional test. In principle, any arbitrary arrangement of the periods of time t1, t2, t3, t4 is possible, provided that overlapping of the periods of time t1, t2, t3, t4 of the different branches is avoided. In the latter case, the signal S would be interrupted both through the first branch Z1 and through the second Z2, and thus entirely interrupted.

Figure 3:
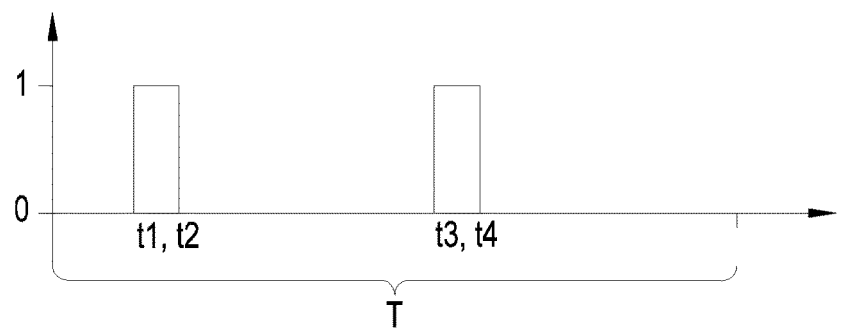
FIG. 3 illustrates a test sequence with periods of time that are overlapped in pairs.
Figure 4:
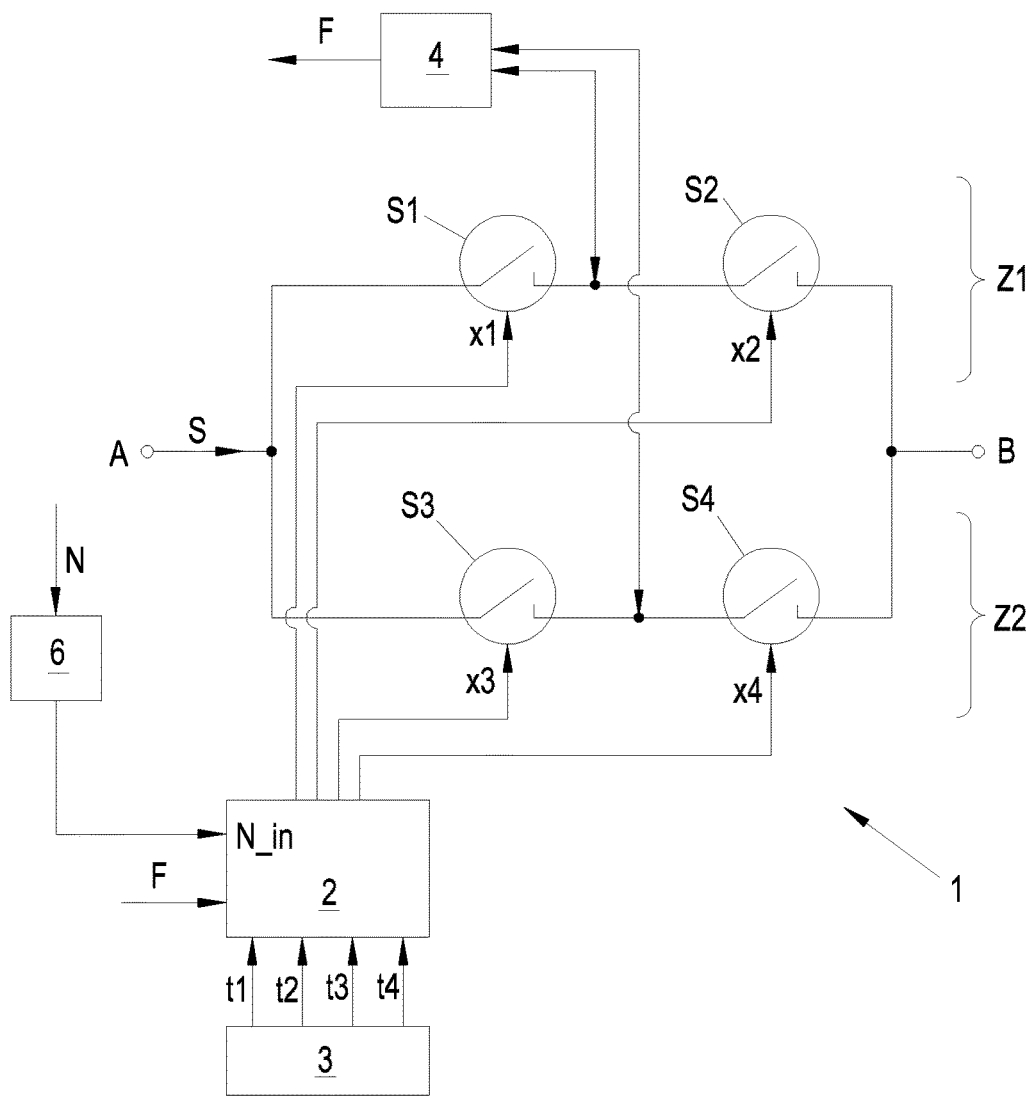
FIG. 4 a switching device having an inhibiting device and a testing device for testing the potential at the test points.

In order to make a determination regarding malfunctioning of at least one switch S1, S2, S3, S4, the testing unit 4 may test a first potential (for example, during the first period of time t1 and the second period of time t2) of a first test point P1 located between the first and second switches S1, S2, and test a second potential (for example, during the third period of time t3 and/or the fourth period of time t4) of a second test point P2 located between the third and fourth switches S3, S4. FIG. 3 illustrates another advantageous test sequence T with—here, complete—overlap between the first and second periods of time t1, t2 and the third/fourth period of time t3, t4, respectively. The respective switches S1, S2 and S3, S4 of one of the branches Z1, Z2 are consequently switched simultaneously in the test sequence T. As an advantageous example, the potential of a first test point P1 located between the first and second switches S1, S2 is tested during the overlapping of the first and second periods of time t1, t2 by the testing unit 4. Additionally, the potential of a second test point P2 located between the third and fourth switches S1, S2 is tested during the overlapping of the third and fourth periods of time t3, t4 by the testing unit 4. Such a configuration is depicted in FIG. 4. The first potential could now be compared with the second potential during the overlapping of the first and second periods of time t1, t2, and the second potential could be compared with the first potential during the overlapping of the third and fourth periods of time t3, t4. It is, however, especially advantageous when testing is performed for whether the first test point P1 has zero potential during the overlapping of the first and second periods of time t1, t2, and for whether the second test point P2 has zero potential during the overlapping of the third and fourth periods of time t3, t4. The testing unit 4 thus determines at least the first and/or second switch S1, S2 to be malfunctioning when the first test point P1 is not zero-potential, i.e., high-impedance, during the first/overlapping second period of time t1, t2. In the same manner, the testing unit 4 determines at least the third and/or fourth switch S3, S4 to be malfunctioning when the second test point P2 is not zero-potential, i.e., high-impedance, during the third/overlapping fourth period of time t3, t4. If a switch S1, S2, S3, S4 is defecting, then either the potential of the point A or the potential of the point B can be applied at the respective test point P1, P2, which is an index for a faulty switch S1, S2, S3, S4. For this configuration, it is advantageous if the switches S1, S2, S3, S4 are configured as semiconductor switches, such as, for example, bipolar transistors, because this ensures inhibition in both directions. If the two switches S1, S2, S3, S4 of a branch Z1, Z2 have been opened at the same time, then the respective first or second test point P1, P2 must have zero potential, which can be verified by the testing device 4 in a simple manner, for example, by switching on a load to the respective test point P1, P2 and verifying a flowing load current The first potential could now also be compared with the second potential during the overlapping of the first and second periods of time t1, t2, and the second potential could be compared with the first potential during the overlapping of the third and fourth periods of time t3, t4, to determine therefrom a malfunction in the switches S1, S2, S3, S4.

In FIG. 4, there is also an inhibiting input N_in present in the switching device 1. The inhibiting input N_in may receive an inhibit signal N—for example, from a parent control, from an emergency stop button—or the error signal F as the inhibit signal N. This arranges for opening of the switches S1, S2, S3, S4 in order to interrupt the signal S at both branches Z1, Z2. Advantageously, the inhibiting input N_in is connected to the control unit 2 or, as depicted in FIG. 4, is an integral component of a rectifier circuit 6 that dynamizes and rectifies the inhibit signal N. The inhibiting input N_in may be an integral component of the control unit 2, for example, if no rectifier circuit 6 is present. An inhibit signal N applied at the inhibiting input N_in thus ensures opening of the switches S1, S2, S3, S4 via the control unit 2 and thus via the control signals x1, x2, x3, x4. It is, of course, also conceivable that the inhibiting input N_in would open the switches S1, S2, S3, S4 via separate signal paths in the form of switch-off signals. It is also conceivable to have a redundant configuration in which both the control signals x1, x2, x3, x4 via the control unit 2 and extra switch-off signals are used in order to ensure that the switches S1, S2, S3, S4 are opened. Control only via the control signals x1, x2, x3, x4 of the control unit 2 or special switch-off signals is also possible, however.

If an inhibit signal N is present, then, for the successful switch-off operation of the signal S—i.e., causing the switches S1, S2, S3, S4 to open through a corresponding control signal x1, x2, x3, x4 and/or a corresponding switch-off signal there would thus only remain for a risk of malfunctioning of one switch S1, S2, S3, S4 since the last functional test Advantageously, therefore, the test sequence T of the testing device 3 and the functional test of the switches S1, S2, S3, S4 through the testing unit 4 are repeatedly on an ongoing basis, preferably at definite, regular intervals, so as to minimize the risk of a malfunction of a switch S1, S2, S3, S4, because functional tests are being performed in an ongoing manner. However, even if one of the switches S1, S2, S3, S4 malfunctions after a successful functional test, the signal S may, as described above, be switched off via the remaining functional switches S1, S2, S3, S4 in the same branch Z1, Z2, if there is an inhibit signal N. It is to be largely ruled out that the even two switches S1, S2, S3, S4 would be defective after successful respective functional tests thereof, and therefore have a malfunction when an inhibit signal N exists. Even in the event of simultaneous malfunction of one switch S1, S2, S3, S4 per branch Z1, Z2, the signal S can be switched off via the respective remaining functional switches S1, S2, S3, S4 of the two branches Z1, Z2. Only when two switches S1, S2, S3, S4 of the same branch Z1, Z2 malfunction—wherein the malfunctioning prevents opening—could the signal S not be switched off. The functional test thus significantly increases the functional safety of the switching device 1.

Figure 5:
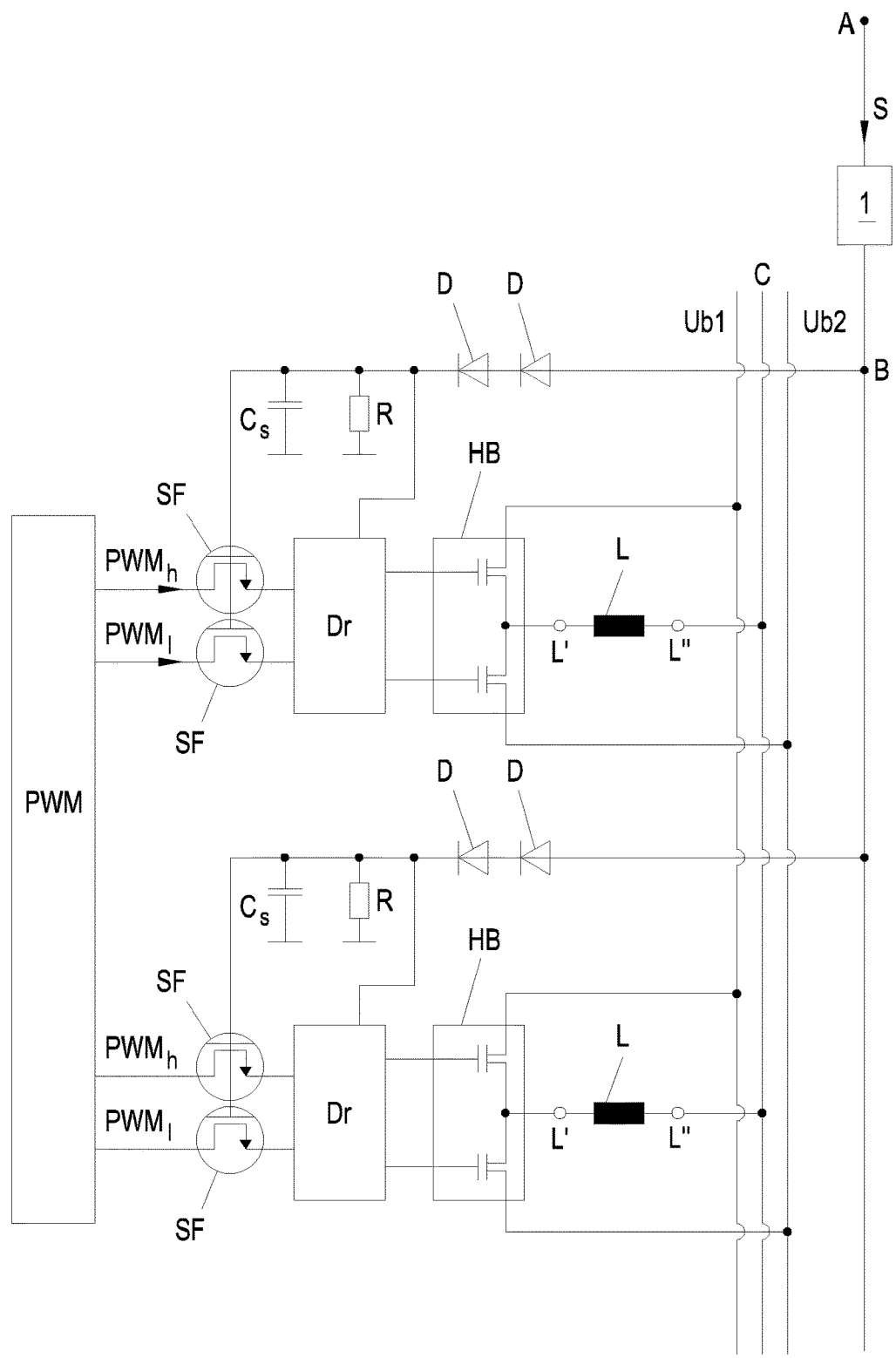
FIG. 5 illustrates the use of a switching device to implement an STO function for a signal of a long-stator linear motor.

FIG. 5 illustrates advantageous use of the method according to the invention to realize an STO function of a long-stator linear motor 5, wherein a signal S is interrupted by the switching device 1. A stator of a long-stator linear motor (LLM) is composed of a plurality of adjacently-arranged LLM coils L, which together form the stator of the LLM. These LLM coils L are controlled individually or in groups. The control of the LLM coils L produces a moving magnetic field that interacts with excitation magnets (usually permanent magnets) at a transport unit of the LLM in order to move the transport unit along the stator. The basic structure and function of an LLM are then sufficiently well known, and are therefore not addressed in further detail here. Also, only two LLM coils L are depicted for the sake of visibility, forgoing depiction of the transport units, the excitation magnets, and the like. To energize the LLM coils L, i.e., in order to generate the magnetic field, an operating voltage between a first operating potential Ub1 and a second operating potential Ub2 is set. If half bridges HB, each composed of a power switch pair, are used for the control of the LLM coils L, then each LLM coil L is connected via a first coil terminal L' to a center point located between the power switches of a power switch pair. The respective second terminals L" of the LLM coils L are connected to a regulation point C, which is kept, for example, to a predetermined potential. A current is imparted into the LLM coils L of the long-stator linear motor by the controlling of a power switch. The signal S leads here, on the one hand, as a supply voltage respectively via two serial diodes D to the driver circuits Dr, which control the half bridges HB. The diodes D are used as protection against a voltage being introduced into the switching device in the event of a defect of a component of the long-stator linear motor.

If the switches S1, S2 of the first branch Z1/the switches S1, S2 of the second branch Z2 are opened during the test sequence T, then the testing device 3 checks whether the first test point T1/the second test point 2 has zero potential. During this time, the switches S1, S2, S3, S4 of the respective other branch Z1, Z2 are closed, whereby the drivers Dr are still connected to the signal S and the test sequence T thus does not cause any drops in the voltage supply through the signal S to the drivers Dr, thus making it possible to select a relatively small size for the back-up capacitors $C_s$ at the inputs of the drivers Dr. As a result thereof, the response time to an interruption of the signal S can be significantly shortened. If the signal S is interrupted, then the driver circuits Dr are disabled, and thus the half bridges HB—constituted of, for example, two MOSFETs—are no longer supplied with voltage. The back-up capacitors $C_S$, however, are advantageously dimensioned so as to bridge brief absences of the signal S, for example, due to an error signal N generated for a brief period as a test, thereby maintaining the signal. Furthermore, additionally, the PWM signal $PWM_h$, $PWM_l$ originating from the PWM controller PWM is interrupted here. This is done through transistors SF connected as source followers, which no longer pass the PWM signal $PWM_{h,l}$ to the drivers Dr if the signal S is interrupted, and are connected to ground via the resistors R. Thus, an STO function that advantageously, on the one hand, interrupts the supply voltage to the driver circuits Dr of the half bridges HB and, on the other hand, even interrupts the PWM signal $PWM_{h,l}$ is realized by means of an interruption of the signal S caused by the switching unit 1. Of course, the STO function may also interrupt solely the supply voltage of the driver circuits Dr or the PWM signal $PWM_{h,l}$.

Figure 6A:
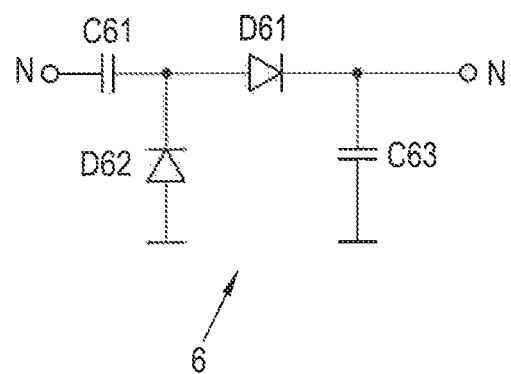
FIGS. 6A-6D illustrate a rectifier circuit for dynamizing and rectifying the inhibit signal.
Figure 6B:
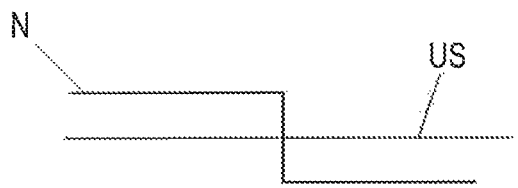
Figure 6C:

FIG. 6A illustrates, by way of example, a rectifier circuit 6 that dynamizes and rectifies the inhibit signal N. For this purpose, the zero-active inhibit signal N is first dynamized, i.e., converted into an oscillating signal and rectified in a simple manner by means of a charge pump, such as is formed in FIG. 6a by the rectifier capacitors C61, C63 and the rectifier diodes D61, D62, in order to realize a separation of potential between the inhibiting input N_in and the switching device 1. The rectifier capacitors C61, C63 may each also be composed of two or more capacitors connected in series, such as is of course common in safety-related uses, whereby a short-circuit of one of the capacitors connected in series has no significant adverse effect. The inhibit signal N, having been smoothed by the rectifier circuit 6, can prevent, for example, an accidental short opening of the switches S1, S2, S3, S4, but can also amplify the inhibit signal N. A dynamized inhibit signal N is represented in FIG. 6C, whereas FIG. 6D shows a rectified and dynamized inhibit signal.

Figure 6D:
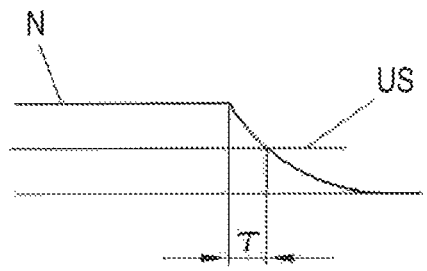

As shown in FIG. 6D, however, the rectifier circuit 6 delays an intended opening of the switches S1, S2, S3, S4 by a trigger time τ. Without the rectifier circuit 6, the inhibit signal N would immediately reach a response threshold (e.g., one defined by the control unit 2), as depicted in FIG. 6B. The dynamized and rectified inhibit signal N only reaches the response threshold US, however, after a trigger time T, and only then opens the switches S1, S2, S3, S4.

In a configuration with a rectifier circuit 6, it is advantageous when the error signal F of the control unit 2, as depicted in FIG. 4, is not supplied as the inhibit signal N via a rectifier circuit 6, but rather directly, because the error signal F does not generally need to be amplified. In addition, unintentional triggering of the error signal F is unlikely, and a prolonged trigger time t in the event of a failure is often undesired.

Figure 7:
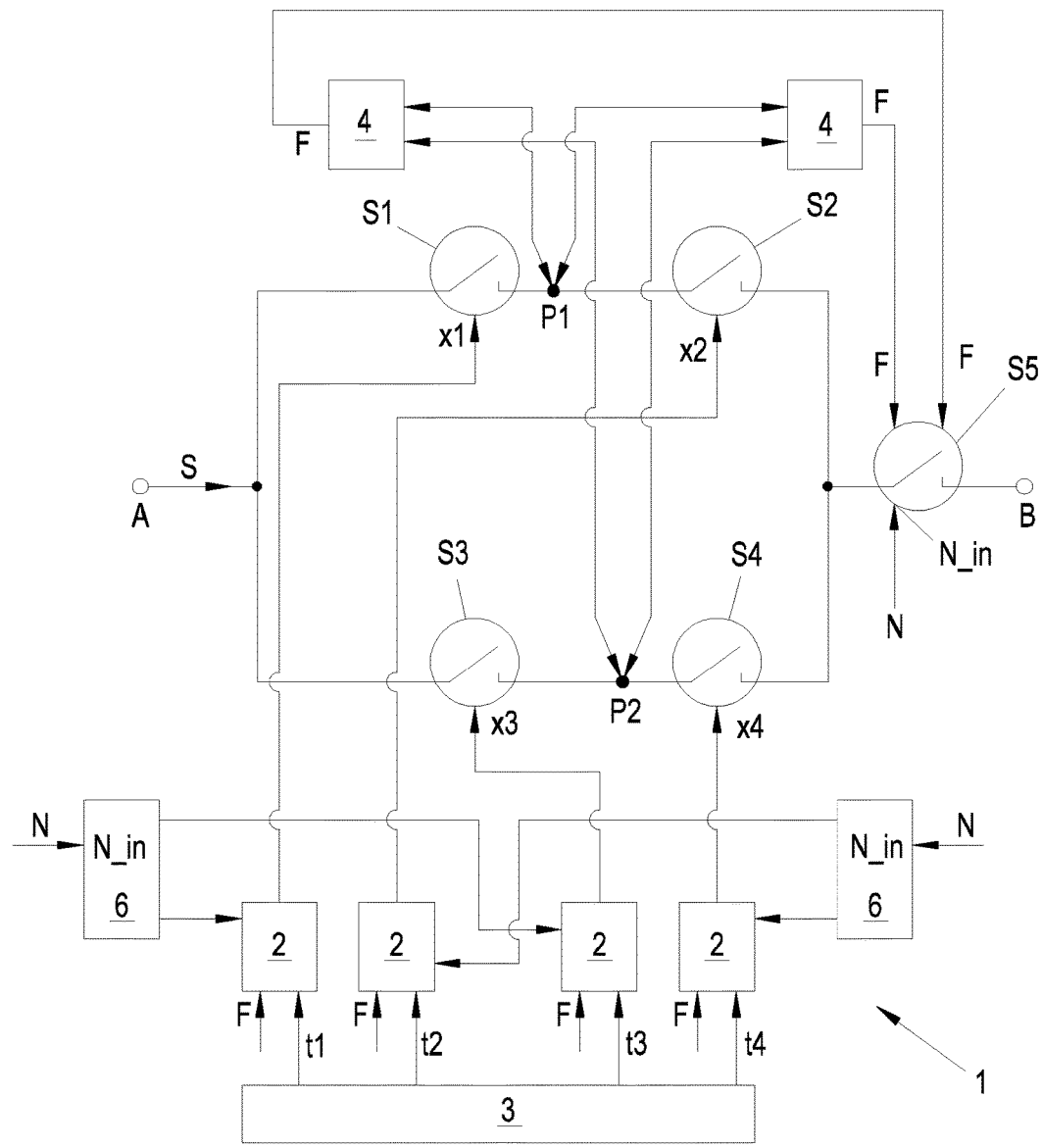
FIG. 7 illustrates a particularly redundant implementation of a switching device.

FIG. 7 illustrates an especially safe configuration in which a testing device 3 is present, but each of the switches S1, S2, S3, S4 has an own control unit 2 that is connected to the testing device 3 and respectively able to open and close a switch S1, S2, S3, S4 by means of a control signal x1, x2, x3, x4. The testing device 3, as described above, has a test sequence T and instructs the control units 2 to control the switches S1 by means of the respective periods of time t1, t2, t3, t4. Also present are two rectifier circuits 6 that are each connected to inhibiting inputs N_in and thus can each receive, dynamize, and rectify the inhibit signal N. Each of the two rectifier circuits 6 also causes one switch S1, S2 of the first branch Z1 each and one switch S3, S4 of the second branch Z2 each to open when there is an inhibit signal N. The first rectifier circuit 6 thus causes, for example, the first switch S1 in the first branch Z1 to open via a control unit 2 and the third switch in the second branch Z2 to open via a control unit 2, for example, when an inhibit signal N is applied. Thus, the signal S is already interrupted on both branches Z1, Z2. Moreover, in this case, the second rectifier circuit 6 thus causes, for example, the second switch S2 in the first branch Z1 to open via a control unit 2 and the fourth switch S4 in the second branch Z2 to open via a control unit 2, for example, when an inhibit signal N is applied. The signal S via the second rectifier circuit 6 is thus interrupted additionally independently of the first rectifier circuit 6, i.e., the first switch S1 and the third switch S3, whereby this redundancy creates reliability. The switches S1, S2, S3, S4 may, as depicted in FIG. 7, be opened via the associated control units 2, and/or also in the form of extra switch-off signals. The control units 2 also advantageously comprise an input for the inhibit signal, in order to control the switches S1, S2, S3, S4 to open when an inhibit signal F is applied.

In addition, the configuration according to FIG. 7 includes two testing devices 4 that, independently of one another, test a first potential of the first test point P1 located between the first and second switches S1, S2 and a second potential of the second test point P2 located between the third and fourth switches S3, S4, in order to determine whether at least one switch S1, S2, S3, S4 is malfunctioning. Of course, the two testing devices 4 may also test for proper functioning of the switches S1, S2, S3, S4 in another manner. If at least one switch S1, S2, S3, S4 is found to be malfunctioning by the testing unit 4, then the testing unit 4 outputs in each case an error signal F, whereby the switches S1, S2, S3, S4 (e.g., via the respective control units 2) are instructed to open, and the signal S is interrupted. Also advantageously, a series switch S5 is arranged in series with the branches Z1, Z2, such as is depicted in FIG. 7, via which series switch S5 the signal S is passed between the first point A and the second point B, and which series switch S5 also interrupts the signal S by an applied, i.e., triggered, error signal F and/or inhibit signal N, thus creating additional redundancy for the interruption of the signal S. The functioning of the series switch S5 is not tested, and covers the special case where the testing device is not active, i.e., the switches S1, S2, S3, S4 are not tested, for example, because of long-lasting application of an error signal N. It is then, however, not possible to detect whether the switches S2, S4 are functioning correctly. The series switch S5 still maintains double error protection for the switching device 1, i.e., that more than two errors (malfunctioning of the switch S2 and the series switch S5, or malfunction of the switch S2 and the series switch S5) would need to happen in order to cause the switching device 1 to fail, which, however, is so unlikely that occurrence thereof is negligible.

What is claimed:

1. A method for switching a signal on a connection between a first point and a second point, the method comprising:
    passing the signal through a first switch and a serial second switch in a first branch connecting the first point and the second point;
    passing the signal through a third switch and a serial fourth switch in a second branch that is parallel to the first branch and connects the first point and the second point; and
    in a test sequence:
    opening the first switch for a first period of time and then closing the first switch;
    opening the second switch for a second period of time and then closing the second switch;
    opening the third switch for a third period of time and then closing the third switch; and
    opening the fourth switch for a fourth period of time and then closing the fourth switch,
    wherein neither the first nor second period of time overlaps with the third or fourth period of time, and a functioning of the first, second, third and fourth switches is tested during a respective first, second, third and fourth period of time, and an error signal is generated in an event of a malfunction of at least one switch.

2. The method according to claim 1, wherein a first potential of a first test point located between the first and second switches is tested, and a second potential of a second test point located between the third and fourth switches is tested, and a determination regarding malfunctioning of at least one switch is made therewith.

3. The method according to claim 2, wherein the first potential is tested during the first period of time and/or the second period of time, and the second potential is tested during the third period of time and/or the fourth period of time.

4. The method according to claim 3, wherein the first and second period of time and the third and fourth period of time, respectively, overlap at least partially, and wherein the first potential is tested during the overlapping of the first and second periods of time, and the second potential is tested during the overlapping of the third and fourth periods of time.

5. The method according to claim 4, wherein the first potential is compared with the second potential during the overlapping of the first and second periods of time, and wherein the second potential is compared with the first potential during the overlapping of the third and fourth periods of time.

6. The method according to claim 4, wherein testing is performed for whether the first test point has zero potential during the overlapping of the first and second periods of time, and for whether the second test point has zero potential during the overlapping of the third and fourth periods of time.

7. The method according to claim 1, wherein the switches are controlled to open when an error signal is generated.

8. The method according to claim 1, wherein the switches are controlled to open when an inhibit signal is received.

9. The method according to claim 8, wherein the inhibit signal is dynamized and then rectified.

10. A switching device for switching a signal on a connection between a first point and a second point, the switching device comprising:
- a first branch having a first switch and a serial second switch being arranged between the first point and the second point;
- a second branch having a third switch and a serial fourth switch being arranged parallel to the first branch;
- at least one control unit, which is connected to the switches and is configured to control the switches via control signals;
- a testing device, which is connected to the at least one control unit and is configured to instruct the at least one control unit, in a test sequence, to:
- open the first switch for a first period of time and then close same again,
- open the second switch for a second period of time and then close same again,
- open the third switch for a third period of time and then close same again, and
- open the fourth switch for a fourth period of time and then close same again,
- wherein neither the first period of time nor the second period of time overlaps with the third or fourth period of time; and
- at least one testing unit is configured to test the functioning of the switches during the respective periods of time, and to generate an error signal in the event of a malfunction of at least one switch.

11. The switching device according to claim 10, wherein the at least one testing unit is connected to the at least one control unit and configured to instruct the at least one control unit to control the switches to open when an error signal has been generated.

12. The switching device according to claim 11, wherein at least one inhibiting input is configured to control the switches to open when an inhibit signal is applied.

13. The switching device according to claim 12, wherein the at least one inhibiting input is connected to the at least one control unit and is configured to instruct the at least control unit to control the switches to open when an inhibit signal is applied.

14. The switching device according to claim 12, wherein the at least one inhibiting input is connected via a rectifier circuit to the at least one control unit, wherein the rectifier circuit is configured in order to dynamize and rectify the inhibit signal.

15. A process of using the switching device according to 10, comprising:
- switching off a supply voltage of the driver circuit of a bridge circuit and/or a PWM signal of a long-stator linear motor or rotary motor that is supplied to a driver circuit.

16. A switching device for switching a signal on a connection between a first point and a second point, the switching device comprising:
- a first branch having a first switch and a serial second switch being arranged between the first point and the second point;
- a second branch having a third switch and a serial fourth switch being arranged parallel to the first branch;
- a testing device configured to produce a test sequence that:
  - opens the first switch for a first period of time and then closes same again,
  - opens the second switch for a second period of time and then closes same again,
  - opens the third switch for a third period of time and then closes same again, and
  - opens the fourth switch for a fourth period of time and then closes same again,
- wherein neither the first period of time nor the second period of time overlaps with the third or fourth period of time; and
- at least one testing unit is configured to test the functioning of the switches during the respective periods of time, and to generate an error signal in the event of a malfunction of at least one switch.

* * * * *